United States Patent
van der Graaf

(10) Patent No.: US 7,331,105 B2
(45) Date of Patent: Feb. 19, 2008

(54) METHOD FOR PLACING COMPONENTS BY MEANS OF AT LEAST ONE COMPONENT PLACEMENT UNIT

(75) Inventor: Sebastiaan Edward van der Graaf, GG Eindhoven (NL)

(73) Assignee: Assembleon N.V., La Veldhoven (NL)

( * ) Notice: Subject to any disclaimer, the term of this patent is extended or adjusted under 35 U.S.C. 154(b) by 209 days.

(21) Appl. No.: 11/080,675

(22) Filed: Mar. 16, 2005

(65) Prior Publication Data
US 2006/0085975 A1 Apr. 27, 2006

(30) Foreign Application Priority Data
Mar. 16, 2004 (EP) .................. 04101060

(51) Int. Cl.
H05K 3/30 (2006.01)
(52) U.S. Cl. ............... 29/834; 29/832; 29/740; 700/302; 702/150
(58) Field of Classification Search ........... 29/709, 29/712, 832–834, 739, 740; 348/87; 700/69, 700/302; 702/150, 127; 356/243.1
See application file for complete search history.

(56) References Cited

U.S. PATENT DOCUMENTS 3,988,535 A * 10/1976 Hickman et al. ............ 348/87
5,500,997 A * 3/1996 Kobayashi et al. .......... 29/834
6,000,123 A * 12/1999 Munezane et al. .......... 29/740

FOREIGN PATENT DOCUMENTS

WO WO 98/24291 A2 6/1998

* cited by examiner

Primary Examiner—Minh Trinh
Assistant Examiner—Donghai D. Nguyen
(74) Attorney, Agent, or Firm—Foley & Lardner LLP

(57) ABSTRACT

Provided is a method and system for placing components by means of at least one component placement unit wherein the component placement unit is moved over a distance between a component pickup position and a component placement position located on a substrate. In addition, a total distance to be covered by the component placement unit is calculated for the number of components to be placed, wherein the number of components to be placed is determined beforehand. This total distance value is subsequently compared with a reference value. If the total distance value is greater than the reference value, the substrate to be provided with the components is rotated with respect to the component pickup position about an axis that extends perpendicularly to the substrate.

9 Claims, 4 Drawing Sheets

METHOD FOR PLACING COMPONENTS BY MEANS OF AT LEAST ONE COMPONENT PLACEMENT UNIT

CLAIM OF PRIORITY

This application claims priority from European Patent Application No. 04101060.4, filed Mar. 16, 2004, the entire teachings of which are incorporated by reference.

FIELD OF THE INVENTION

The present invention relates to methods of placing components by component placement units. More specifically, the invention relates to a method for placing components by means of at least one component placement unit, where the component placement unit can be moved over a distance between a component pickup position and a component placement position located on a substrate.

The invention further relates to a system comprising at least one component placement unit for placing components, where the component placement unit can be moved over a distance between a component pickup position and a component placement position located on a substrate.

BACKGROUND OF THE INVENTION

In general component positioning methods and systems, which are known from WO-A-98/24291, components are picked up from at least one component pickup position by at least one component placement unit and moved over a distance to a component placement position located on a substrate. A drawback of this known method is the fact that the capacity, i.e., the number of components to be placed per unit time, may be relatively low in some cases, because the total distance to be covered by the component placement unit is relatively great in some cases when a specific number of components need to be placed on the substrate.

Thus, a need exists for a component placement method and system that allows for both higher capacity and speed.

SUMMARY OF THE INVENTION

In certain embodiments, the present invention provides for a method for increasing the capacity of the component placement unit.

This method is accomplished by calculating a total distance to be covered by the component placement unit for a number of components to be placed. Generally, the number of components is determined beforehand, i.e., before the components are moved. Then the total distance is compared with a reference value, after which, if said total distance is greater than the reference value, the substrate onto which the components are to be placed is rotated with respect to the component pickup position about an axis that extends transversely to the substrate, until the total distance is smaller than or equal to the reference value. Since the total distance to be covered between the component pickup position and the component placement position is reduced for a given number of components to be placed, and consequently the time needed for covering said distance is reduced, the number of components to be placed by means of the component placement unit per unit time, i.e. the capacity, is increased.

Another embodiment of a method of the invention is characterized in that the reference value is equal to a total distance to be covered by the component placement unit where a substrate has been rotated through a predefined angle. By calculating the total distance to be covered in the case of a rotated substrate and regarding this calculated value as a reference value, it is ensured that, after comparison and possible rotation, the component placement unit will at all times cover the shortest total distance, thus decreasing the required time and increasing the capacity.

Another embodiment is characterized in that an average distance to be covered by the component placement is calculated from the total distance to be covered. For example, the average distance to be covered can be calculated in a simple manner by dividing the total distance to be covered by the number of components to be placed.

Yet another embodiment characterizes a method where the reference value is equal to an average distance to be covered between a centre line of the substrate, where the centre line of the substrate extends transversely to a direction of movement of the component placement unit and the component pickup position. This method determines a reference value. This method is particularly suitable if movement of the component placement unit between a component pickup position and a component placement position is only possible in a direction that extends transversely to the direction of movement of the substrate.

Yet a further embodiment is characterized in that the substrate is rotated in steps of approximately 90 degrees by means of a rotation system. For example, the substrate can be rotated with respect to the pickup position in a simple manner using a rotation system. In certain embodiments, such as in the case of rectangular substrates, the substrate is preferably rotated through about 180 degrees using the rotation system. However, in the case of square substrates, a rotation through about 90 degrees may already result in a higher capacity.

Yet another embodiment characterizes a method where the total distance to be covered by the component placement unit is calculated on the basis of design data of a substrate. In this embodiment, the total distance can be calculated relatively quickly and accurately by using the design data. As used herein, the term design data is understood to mean data that provides information about the layout of a substrate and the positions of the components to be placed thereon.

In another embodiment, the present invention provides a system having a relatively high capacity. This embodiment comprises a system where a total distance to be covered by the component placement unit can be calculated for a number of components to be placed, where the number of components is determined beforehand. If the total distance is greater than the reference value, a substrate onto which the components are to be placed can be rotated with respect to the component pickup position about an axis that extends transversely with respect to the substrate until the calculated distance is smaller than or equal to the reference value.

By rotating the substrate until the calculated value is smaller than or equal to the reference value, the total distance to be covered for a number of components to be placed is reduced, the time is reduced and consequently the capacity of the component placement unit is increased.

Yet a further system embodiment includes a processor. Using a processor, all data regarding a substrate and the positions at which specific components are to be placed can be made available in the processor in a relatively simple manner. By comparing the average distance to be covered by the component placement unit for a number of components to be placed, calculated by means of the processor, with a reference value input into the processor, it can readily be determined whether a substrate is to be rotated by means of a rotation system so as to realize a capacity increase.

Another embodiment is characterized in that the substrate can be rotated by means of a rotation system that is integrated in the system. In this embodiment, the substrate can be rotated in a simple manner by means of an integrated rotation system. In addition, a rotation system that is integrated in the system may take up less space than a non-integrated rotation system.

Nevertheless, yet another embodiment includes a system where the substrate can be rotated by means of a detachably connected rotation system. An advantage of a detachably connected rotation system includes that the rotation system may be used with various systems.

These and other features, aspects, and advantages of the present invention will become apparent from the following description, appended claims, and the accompanying exemplary embodiments shown in the drawings, which are briefly described below.

BRIEF DESCRIPTION OF THE DRAWINGS

Like parts are indicated by the same numerals in the figures.

DETAILED DESCRIPTION

Figure 1:
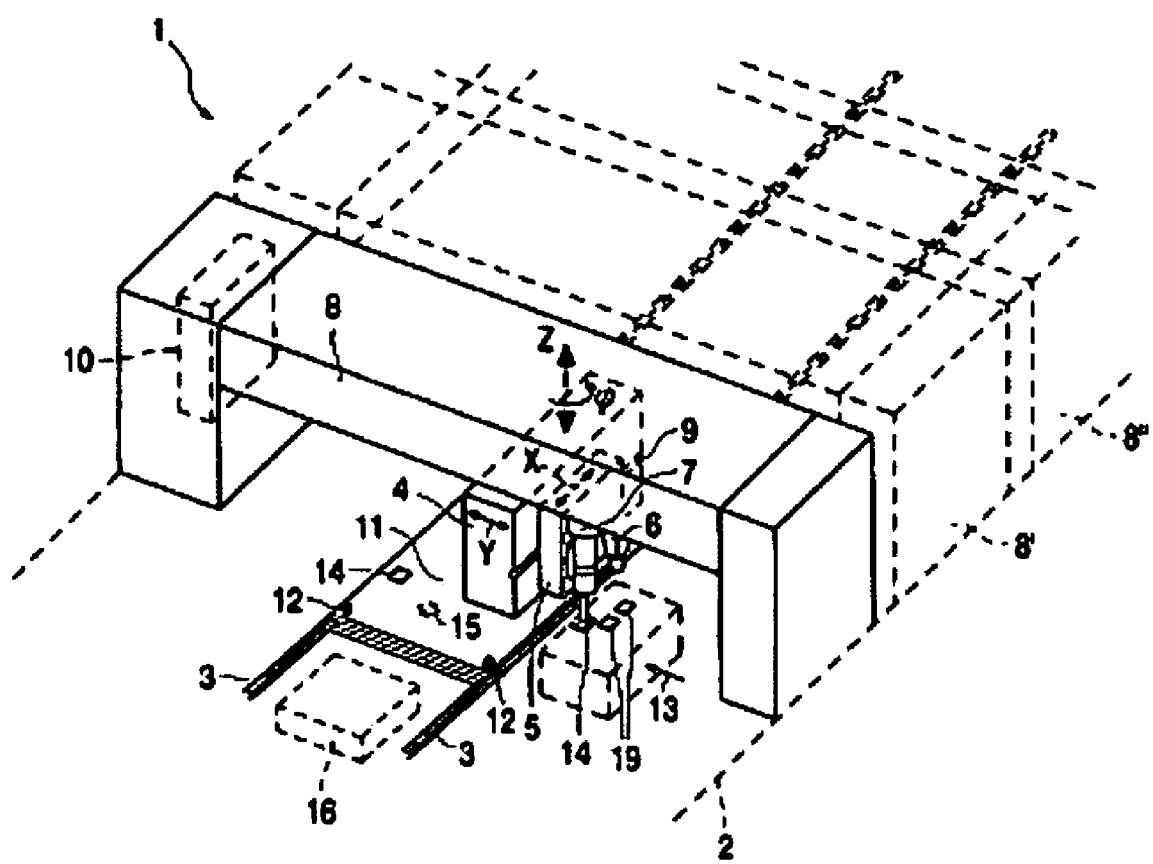
FIG. 1 is a perspective view of a system according to the invention.
Figure 4:
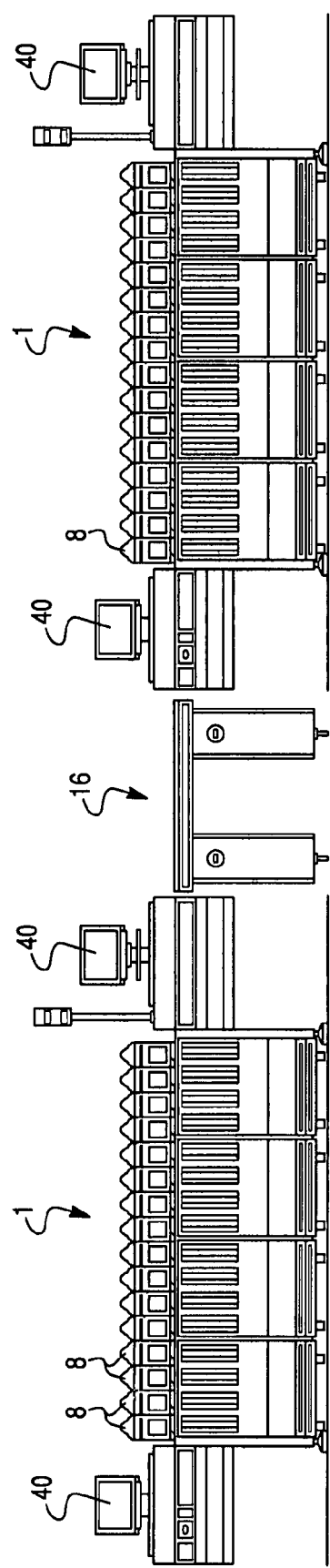
FIG. 4 is a side elevation of two systems according to the invention, which are coupled by means of a rotation system.

The present invention provides a method and a system of placing components. For example, FIG. 1 shows a system 1 according to the invention comprising a frame 2, transport rails 3 supported by the frame 2 and a device 4 which is movable above the transport rails 3, to which a component placement unit 5 is connected. The component placement unit 5 is provided with a camera 6 and a nozzle 7. The device 4 can be moved, by means that are known per se, in the direction indicated by the arrow Y and in the opposite direction via a guide (not shown) that is mounted on a bridge 8. The component placement unit 5 is movable in the direction indicated by the arrow X over a guide 9 that is present on the device 4. The nozzle 7 is furthermore movable in the direction indicated by the arrow Z and in the opposite direction. The system 1 also comprises a processor 10. The processor 10 may include monitors 40, as shown in FIG. 4.

A substrate 11 is moved in the direction indicated by the arrow X and in the opposite direction to a position located near the device 4 by means of the transport rails 3. On the substrate 11, a number of reference elements 12 are provided, as are a number of positions 15 at which components are to be placed. A number of component supply devices 13 are arranged beside the transport rails 3, from where the component 14 can be picked up each time by the nozzle 7, which component must subsequently be positioned at a desired component placement position 15 on the substrate 11.

Several bridges 8, 8', 8" are provided on the frame 2, over which devices 4 are movable (indicated in dotted lines in FIG. 1).

Disposed between the transport rails 3 is a rotation system 16, by means of which a substrate 11 can be rotated in steps of 180 degrees in the direction indicated by the arrow Φ or in the opposite direction. To rotate the substrate 11, the substrate 11 is lifted off the rails 3 temporarily by means of the rotation system 16.

Figure 2:
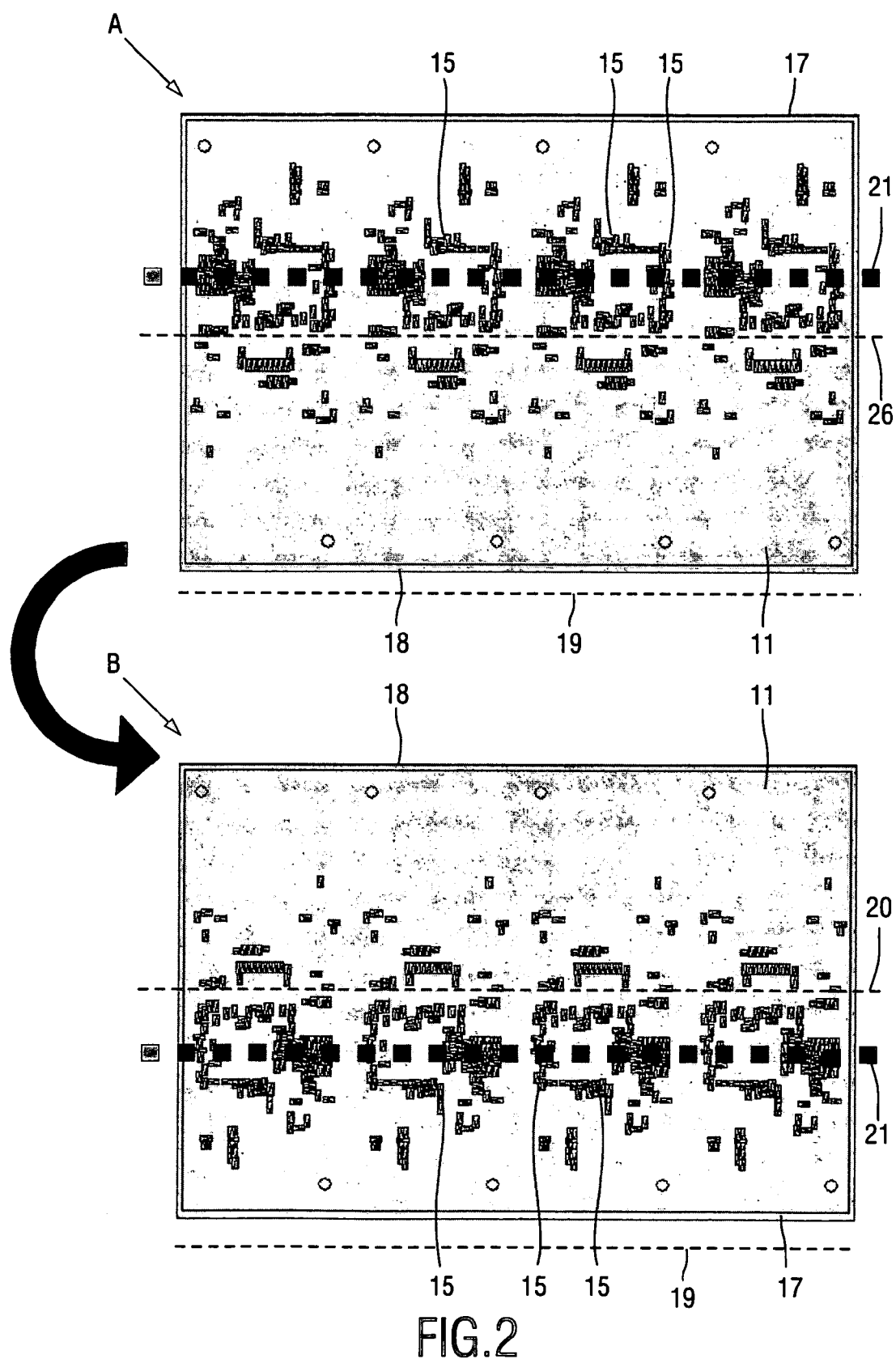
FIG. 2 shows two top plan views A, B of a substrate onto which the components are to be placed.

FIG. 2 shows two top plan views A, B of one and the same substrate 11. The substrate 11 comprises sides 17, 18. The substrate 11 in the lower view B has been rotated through 180 degrees with respect to the substrate 11 in the upper view A. The position of the component supply device 13 relative to the substrate 11 is indicated in a dotted line.

The substrate 11 has a centre line 20, which extends transversely to the direction of movement of the substrate 11. Furthermore, a dotted line 21 is drawn between the side 17 and the centre line 20 in the two views A, B of the substrate 11.

The dotted line 21 represents an average distance to be covered by the component placement unit 4, in a direction transverse to the direction of movement of the substrate 11, for the purpose of picking up a number of components 14 from the component pickup position 13 and placing said components 14 at component placement positions 15.

The value indicated by the dotted line 21 is calculated by a processor 10 from design data. Following the calculation, the processor compares the average distance to be covered by the component placement unit 5 with the distance to be covered to the centre line 20. The distance "centre line 20—component pickup position 19" is regarded as a reference value here. If the average distance indicated by the dotted line 21 is greater than the reference value represented by the centre line 20, as is the case with the substrate 11 that is shown in view A, the total distance to be covered with the component placement unit 5 for placing a number of components can be reduced in that the rotation system 16 rotates the substrate 11 through 180 degrees. As view B shows, the dotted line 21 is located closer to the component supply device 13 than in view A, so that the distance to be covered by the component placement unit 5 for placing a number of components is smaller, so that the component placement unit 11 can place more components 14 per unit time on the substrate 11, given the same speed of movement, and the capacity of the system 1 is relatively high.

The distance "centre line substrate 20—component pickup position 19" can be used in particular if the device 4, as well as the component placement unit 5, are moved in one direction only, e.g. only in the y-direction indicated in FIG. 1, upon movement between the component pickup position 19 and the component placement position 15.

It is also possible to utilize the rotation of the substrate 11 for a system 1 in which the component placement unit 5 is movable in the x-direction as well as in the y-direction. By shortening the total distance both in the x-direction and in the y-direction, the time needed for placing the components is reduced as well, and consequently the capacity of the system 1 is increased.

Figure 3A:
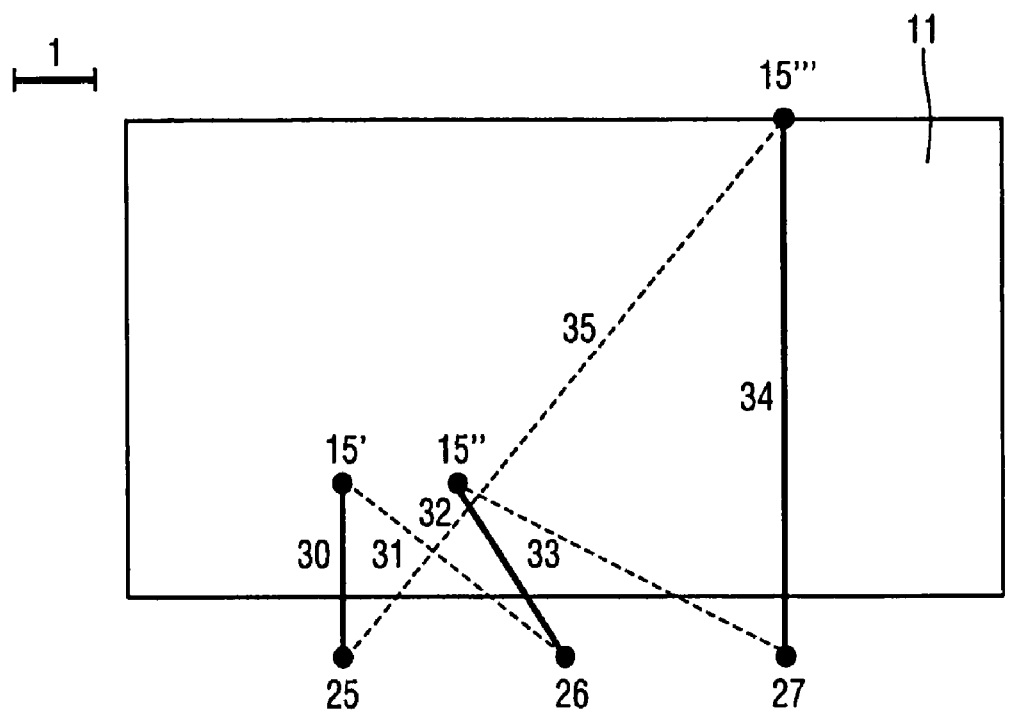
FIGS. 3a and 3b show top plan views of another substrate.
Figure 3B:
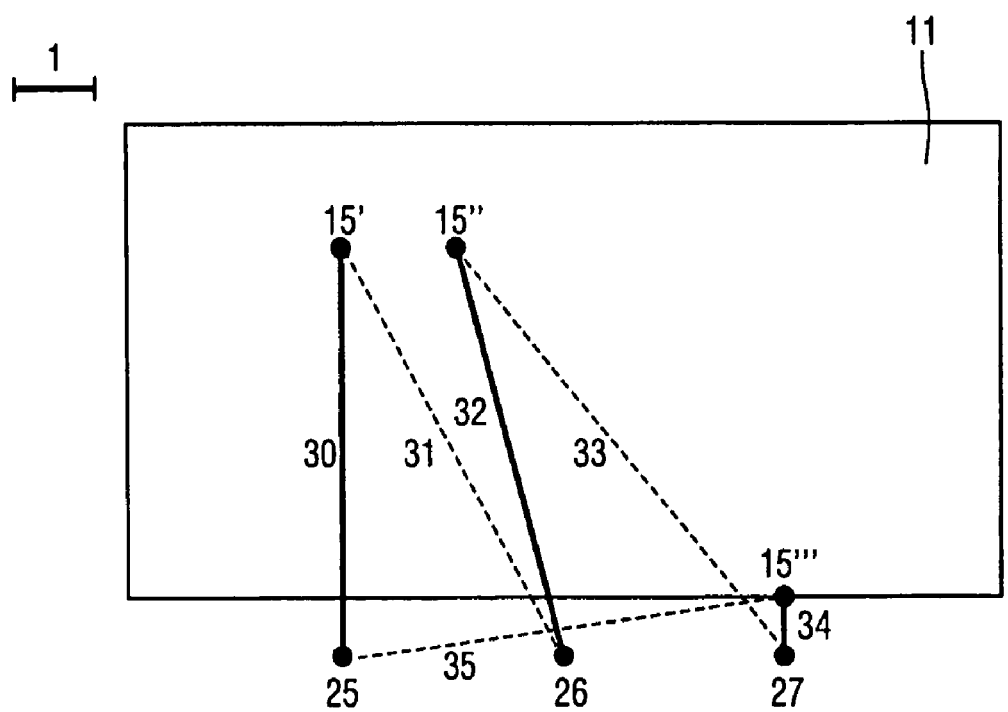

An example of the determination of the reference value for the component placement unit 5 that is movable both in the x-direction and in the y-direction is shown in FIGS. 3a and 3b.

FIG. 3a is a top plan view of a substrate 11. FIG. 3b is a top plan view of one and the same substrate 11, in which the substrate 11 has been rotated through 180 degrees, however. Numerals 25, 26, 27 indicate different component pickup positions, whilst numerals 15', 15", and 15'", indicate the component placement positions. The total distance to be covered by the component placement unit 5 for picking up and placing components in the case of a non-rotated substrate 11 and in the case of a rotated substrate 11 is the sum of the distances 30, 31, 32, 33, 34 and 35. For easy reference, the distances between the component pickup positions 25, 26, 27 and the component placement positions 15', 15", 15''' are illustrated in full lines, and the distances between the component placement positions 15', 15", and 15''' and the component pickup positions 25, 26, 27 are illustrated in dotted lines.

The reference value is calculated by the processor 10 in that the total distance to be covered in the case of a rotated substrate 11 (FIG. 3b) is calculated. Following that, the calculated total distance to be covered in the case of a non-rotated substrate (FIG. 3a) is compared with the reference value. If the total distance to be covered in the case of the non-rotated substrate is greater than the reference value, the substrate will have to be rotated through 180 degrees. The shortest distance can at all times be calculated by means of a reference value that has been determined in this manner.

For example, when calculated for the unit that is shown in FIG. 3a, the total distance to be covered by the component placement unit 5 is 39.36 in the case of a non-rotated substrate (FIG. 3a) and 41.62 in the case of a rotated substrate (FIG. 3b).

The reference value now equals 41.62, which value is compared with the value 39.36 by the processor. Since the total distance is shorter in the case of the non-rotated substrate 11, the substrate 11 need not be rotated in this case.

FIG. 4 is a side elevation of two systems 1, 1', which are coupled by means of a movable rotation system 16. Such a rotation system is positioned between two systems 1, 1', for example, if in system 1 the highest number of components per unit time can be placed on a non-rotated substrate in system 1, whereas in system 1' the highest number of components per unit time can be placed on a rotated substrate.

In system 1, the component placement units 5 mainly place components on the side of the centre line that is most proximate to the component pickup positions 19 that are located on one side of the substrate. After being rotated through 180 degrees by means of the rotation system 16, the rotated substrate 11 is provided with components mainly on the other side of the centre line in system 1'. The total distance covered by the component placement units of system 1 and system 1' is reduced by means of the rotation system 16.

The rotation system 16 may be disposed in front of a number of bridges 8, 8', 8" and the associated component placement units, as shown in FIG. 1. As in FIG. 4, the processor then calculates the total distance to be covered by all component placement units and compares this distance value with a reference value. The skilled artisan understands that the processor of the current invention is not meant to be limiting and a processor as used herein encompasses hand calculations. It is possible to dispose a separate rotation system at each bridge and the component placement unit connected thereto, so that the total distance to be covered can be reduced for each component placement unit 5 individually by means of the rotation system.

In addition, FIG. 4 illustrates monitors 40 of the processor 10.

If a system comprises two component supply devices positioned opposite each other, it is moreover possible to exchange the component supply devices rather than rotate the substrate that is positioned between the component supply devices, which can be effected by detachably connecting said component supply devices to the system.

In principle, the angle through which a rectangular substrate is rotated by means of a rotation system can be selected at random. If steps of a magnitude other than 180 degrees are used, however, the transport rails must be provided with supplementary means in order to ensure a correct guidance of a substrate that has been rotated through a randomly selected angle. A square substrate, on the other hand, can be rotated in steps of 90 degrees without adaptations of the transport rails being required. Nevertheless, these rotation values are not meant to be limiting and the skilled artisan can easily determine the appropriate rotation based on the shape of the substrate.

As will be understood by one skilled in the art, for any and all purposes, particularly in terms of providing a written description, all ranges disclosed herein also encompass any and all possible subranges and combinations of subranges thereof. Any listed range can be easily recognized as sufficiently describing and enabling the same range being broken down into at least equal halves, thirds, quarters, fifths, tenths, etc. As a non-limiting example, each range discussed herein can be readily broken down into a lower third, middle third and upper third, etc. As will also be understood by one skilled in the art all language such as "up to," "at least," "greater than," "less than," "more than" and the like include the number recited and refer to ranges which can be subsequently broken down into subranges as discussed above. In the same manner, all ratios disclosed herein also include all subratios falling within the broader ratio.

One skilled in the art will also readily recognize that where members are grouped together in a common manner, such as in a Markush group, the present invention encompasses not only the entire group listed as a whole, but each member of the group individually and all possible subgroups of the main group. Accordingly, for all purposes, the present invention encompasses not only the main group, but also the main group absent one or more of the group members. The present invention also envisages the explicit exclusion of one or more of any of the group members in the claimed invention.

All references, patents and publications disclosed herein are specifically incorporated by reference thereto. Unless otherwise specified, "a" or "an" means "one or more".

While preferred embodiments have been illustrated and described, it should be understood that changes and modifications can be made therein in accordance with ordinary skill in the art without departing from the invention in its broader aspects as defined in the following claims.

What is claimed is:

1. A method for placing components by at least one component placement unit, the component placement unit placing each component by moving over a distance between a component pickup position and a component placement position located on a substrate, comprising (a) calculating a total distance to be covered by the component placement unit for a number of components to be placed when the substrate is in a first position;

(b) comparing the total distance to a reference value, the reference value being a calculated total distance to be covered by the component placement unit for the number of components to be placed when the substrate is in a rotated position that is rotated relative to the first position; and (c) rotating, if the total distance is greater than the reference value, the substrate onto which the components are to be placed relative to a component pickup position about an axis that extends transversely to the substrate until the determined total distance is smaller than or equal to the reference value to minimize the total distance over which the component placement unit is moved in order to place the number of components on the substrate;

(d) moving the component placement unit over a distance between the component pickup position and the component placement position located on the substrate; and (e) placing a component on the substrate.

2. The method of claim 1, wherein the reference value is equal to a total distance to be covered by the component placement unit where the substrate has been rotated through a predefined angle.

3. The method of claim 2, further comprising calculating an average distance to be covered from the total distance.

4. The method of claim 3, wherein the reference value is equal to an average distance to be covered between a centre line of the substrate, and a component pickup position wherein the centre line of the substrate extends transversely to a direction of movement of the component placement unit, and a component pickup position.

5. The method of claim 1, further comprising calculating an average distance to be covered from the total distance.

6. The method of claim 1, comprising rotating the substrate in steps of approximately 90 degrees with a rotation system.

7. The method of claim 1, comprising rotating the substrate in steps of approximately 180 degrees with a rotation system.

8. The method of claim 1, wherein the rotation comprises rotation based on a randomly selected angle.

9. The method of claim 1, wherein the total distance to be covered by the component placement unit is determined using design data of the substrate.

* * * * *